(12) United States Patent
Newton et al.

(10) Patent No.: US 10,139,062 B2
(45) Date of Patent: *Nov. 27, 2018

(54) WALL PACK LIGHT FIXTURE

(71) Applicant: Cooper Technologies Company, Houston, TX (US)

(72) Inventors: Chad Stuart Newton, Tyrone, GA (US); Christopher Michael Bryant, Social Circle, GA (US)

(73) Assignee: Cooper Technologies Company, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/620,104

(22) Filed: Jun. 12, 2017

(65) Prior Publication Data
US 2017/0276306 A1 Sep. 28, 2017

Related U.S. Application Data

(63) Continuation of application No. 14/330,728, filed on Jul. 14, 2014, now Pat. No. 9,677,727, which is a
(Continued)

(51) Int. Cl.
*F21V 15/01* (2006.01)
*F21S 8/00* (2006.01)
(Continued)

(52) U.S. Cl.
CPC .............. *F21S 8/036* (2013.01); *B23P 11/00* (2013.01); *F21S 8/033* (2013.01); *F21V 7/0066* (2013.01); *F21V 15/01* (2013.01); *F21V 17/00* (2013.01); *F21V 17/107* (2013.01); *F21V 23/003* (2013.01); *F21V 29/763* (2015.01); *H01R 43/00* (2013.01); *H05K 13/00* (2013.01);
(Continued)

(58) Field of Classification Search
None
See application file for complete search history.

(56) References Cited

U.S. PATENT DOCUMENTS

D135,107 S 2/1943 Szalla
2,732,484 A 1/1956 Lipscomb
(Continued)

OTHER PUBLICATIONS

Press Release, RAB Lighting, Oct. 12, 2010, RAB LPACK13 Makes the Switch to LED Even Easier.
(Continued)

*Primary Examiner* — Anh Mai
*Assistant Examiner* — Zachary J Snyder
(74) *Attorney, Agent, or Firm* — King & Spalding LLP

(57) ABSTRACT

A lighting fixture includes a first housing portion and a second housing portion. The first housing portion includes a base and a wall extending outwardly from substantially the perimeter of the base. A top portion of the wall includes one or more hinges extending outwardly therefrom. The second housing portion includes a front panel and a side panel extending outwardly from substantially the perimeter of the front panel. A top portion of the front panel includes at least one slot. The second housing is coupled to the first housing in an open position when the hinge is inserted into the slot and the front panel is disposed elevationally above the base. The second housing is coupled to the first housing in an operational position when the hinge is inserted into the slot and the front panel covers the base.

20 Claims, 8 Drawing Sheets

Related U.S. Application Data continuation of application No. 13/091,922, filed on Apr. 21, 2011, now Pat. No. 8,777,460.

(51) Int. Cl.

| | |
|---|---|
| *F21V 29/76* | (2015.01) |
| *F21V 17/10* | (2006.01) |
| *B23P 11/00* | (2006.01) |
| *F21V 17/00* | (2006.01) |
| *H01R 43/00* | (2006.01) |
| *F21V 7/00* | (2006.01) |
| *F21V 23/00* | (2015.01) |
| *H05K 13/00* | (2006.01) |
| *F21Y 101/00* | (2016.01) |
| *F21Y 115/10* | (2016.01) |

(52) U.S. Cl.
CPC ....... *F21Y 2101/00* (2013.01); *F21Y 2115/10* (2016.08); *Y10T 29/49169* (2015.01); *Y10T 29/49194* (2015.01); *Y10T 29/49826* (2015.01)

(56) References Cited

U.S. PATENT DOCUMENTS

| | | | |
|---|---|---|---|
| 3,047,716 | A | 7/1962 | Hoxie et al. |
| D203,060 | S | 11/1965 | Schaefer |
| 3,263,071 | A | 7/1966 | Fabbri |
| D228,667 | S | 10/1973 | Anderson, Jr. |
| D248,184 | S | 6/1978 | Roberts |
| D285,258 | S | 8/1986 | Hamasaki |
| D287,646 | S | 1/1987 | Ayukawa |
| D289,087 | S | 3/1987 | Kobata |
| D380,853 | S | 7/1997 | Johnson |
| 5,957,573 | A | 9/1999 | Wedekind et al. |
| D415,305 | S | 10/1999 | Putman |
| D421,816 | S | 3/2000 | Gongora et al. |
| D456,932 | S | 5/2002 | Crosby |
| D465,050 | S | 10/2002 | Crelin |
| D499,834 | S | 12/2004 | Yu et al. |
| 6,905,222 | B1 | 6/2005 | Russello et al. |
| D527,134 | S | 8/2006 | Bagen |
| D544,991 | S | 6/2007 | Guercio |
| D552,292 | S | 10/2007 | Martineau |
| D553,789 | S | 10/2007 | Akinrele et al. |
| D562,491 | S | 2/2008 | Dicola |
| D574,995 | S | 8/2008 | Boyer |
| D577,146 | S | 9/2008 | Haugaard et al. |
| D579,141 | S | 10/2008 | Guercio |
| D579,144 | S | 10/2008 | Wnek et al. |
| D590,088 | S | 4/2009 | Dworschak |
| D590,983 | S | 4/2009 | Sabernig |
| D595,447 | S | 6/2009 | Purcell |
| D608,040 | S | 1/2010 | Guercio |
| D609,387 | S | 2/2010 | Compton |
| D610,296 | S | 2/2010 | Boissevain |
| D612,975 | S | 3/2010 | Guercio et al. |
| D617,491 | S | 6/2010 | Dordoni |
| D626,271 | S | 10/2010 | Verelst |
| D634,873 | S | 3/2011 | Guercio |
| D634,878 | S | 3/2011 | Guercio et al. |
| D643,147 | S | 8/2011 | Guercio et al. |
| D643,571 | S | 8/2011 | Chen |
| D644,370 | S | 8/2011 | Lickiss |
| D647,662 | S | 10/2011 | Vereist et al. |
| D650,112 | S | 12/2011 | Bryant |
| D653,377 | S | 1/2012 | Guercio |
| D658,803 | S | 5/2012 | Maxik et al. |
| D659,895 | S | 5/2012 | Maxik et al. |
| D668,810 | S | 10/2012 | Bryant |
| D678,596 | S | 3/2013 | Bryant |
| D688,406 | S | 8/2013 | Goldy |
| D691,320 | S | 10/2013 | Guercio et al. |
| D695,445 | S | 12/2013 | Panchisin et al. |
| D698,978 | S | 2/2014 | Bryant |
| D698,986 | S | 2/2014 | Reynolds |
| D699,386 | S | 2/2014 | Park et al. |
| D699,887 | S | 2/2014 | Chen |
| D707,385 | S | 6/2014 | Wardenburg et al. |
| D714,992 | S | 10/2014 | Bryant |
| D716,990 | S | 11/2014 | Yu |
| D719,699 | S | 12/2014 | Bryant |
| D728,142 | S | 4/2015 | Dungan |
| D730,569 | S | 5/2015 | Bryant |
| 2007/0029456 | A1 | 2/2007 | Mier-Langner et al. |
| 2008/0232081 | A1 | 9/2008 | Martinez |
| 2012/0268952 | A1 | 10/2012 | Newton |

OTHER PUBLICATIONS

Press Release, RAB Lighting, Feb. 9, 2010, RAB Lighting launches 20W LED Wallpack for outdoor use.

Press Release, RAB Lighting, Dec. 23, 2009, RAB Lighting Introduces new LED Wallpack.

Lighting Science; Wallpack; Product Specification Sheet; Nov. 2010.

RAB Lighting. WPLED52 Series Installation Instructions. p. 1-2. www.rabweb.com; 2011; Sep. 11, 2015 Office Action for U.S. Appl. No. 14/749,263.

RAB Lighting, The New LPACK52, Specification Sheet, Sep. 11, 2015 Office Action for U.S. Appl. No. 14/749,263.

US 10,139,062 B2

WALL PACK LIGHT FIXTURE

RELATED APPLICATIONS

The present application is a continuation of and claims priority under 35 U.S.C. § 120 to U.S. Non-Provisional patent application Ser. No. 14/330,728, titled "Wall Pack Light Fixture," and filed Jul. 14, 2014, which is a continuation of and claims priority under 35 U.S.C. § 120 to U.S. Non-Provisional patent application Ser. No. 13/091,922, titled "Wall Pack Light Fixture," and filed on Apr. 21, 2011. The entire contents of each of the above identified related patent applications are hereby incorporated herein by reference.

TECHNICAL FIELD

The present invention relates generally to light fixtures. More specifically, the present invention relates to wall pack light fixtures that include a housing formed with two or more components.

BACKGROUND

One particular type of light fixture is known as a wall pack light fixture. A wall pack light fixture is typically installed to a support structure, such as a vertically oriented wall. Several wall pack light fixtures include housings formed of two or more individual components coupled to one another. The individual components of the housing include at least a mounting portion and a cover coupled to the mounting portion. The wall pack light fixture typically houses one or more light sources for providing illumination to a desired illuminated area.

Installation of the housing of conventional wall pack light fixtures occurs in at least two separate steps. The mounting portion is first mounted to the wall and then the cover is later coupled to the mounting portion in a proper position. During this step where the mounting portion is mounted to the wall, the mounting portion is securely mounted to the wall or is screwed into a J-box. One or more electrical wires that are located within or adjacent to the support structure are routed into the mounting portion and electrically coupled to the light source, thereby providing current to the light source. Also during this step, the cover is typically propped in an inconvenient and/or in a costly manner. In certain instances, the inconvenient manner in which the cover is propped causes the installer to rush through the installation and possibly make mistakes.

Conventional approaches to propping the cover include the installer holding the cover in one hand, thereby causing the installer to make wiring connections with the other hand. This approach is very inconvenient to the installer and does not allow the installer to easily make the connections. Another conventional approach to propping the cover includes placing the cover on the ladder. This approach is not safe since the cover can fall off of the ladder and be damaged or cause injury to a person. Alternatively, the placement of the cover can interfere with the installer's installation of the fixture. Another conventional approach to propping the cover includes placing the cover on a safety cable. This approach adds additional time for setting up and disassembling the safety cable, which therefore adds additional costs for the installation. Also, the cover can be inadvertently disconnected from the safety cable or can come in the way of the installer during the installation process. Another conventional approach to propping the cover includes using captive hinges located along the left or right side of the wall pack light fixture that allow the cover to rotate open in a horizontal manner. This approach requires that there be sufficient room in front of the wall pack light fixture so that the cover can fully rotate about the captive hinges. Thus, the installer has to lean backwards to allow the cover to rotate, which can cause the installer to fall off the ladder. Alternatively, the installer has to maintain his ladder a required distance away from the wall pack light fixture so that when he climbs up the ladder, he is not interfering with the rotation of the cover. According to this situation, the installer has to lean forward to perform the installation of the fixture because the ladder is not positioned as close to the fixture as typically desired.

SUMMARY

An exemplary embodiment of the invention includes a housing. The housing can include a mounting box and a cover box. The mounting box can include a base and a top wall that extends outwardly from the base. The top wall can include at least one hinge extending outwardly from the top wall. The cover box can include a front panel and a top panel extending outwardly from the front panel. The top panel can include at least one slot formed therein. The cover box can be coupled to the mounting box in an operational position and in an open position. The operational position can occur when the hinge is inserted into the slot and the front panel covers the base. The open position can occur when the hinge is inserted into the slot and the front panel is disposed elevationally above the base.

Another exemplary embodiment of the invention includes a light fixture. The light fixture can include a housing and a light source. The housing can include a mounting box and a cover box. The mounting box can include a base and a wall extending outwardly from substantially the perimeter of the base. A top portion of the wall can include at least one hinge extending outwardly from the wall. The cover box can include a front panel and a side panel extending outwardly from substantially the perimeter of the front panel. A top portion of the side panel can include at least one slot formed therein. A bottom portion of the side panel can include an opening formed therein. The light source can be disposed within the housing and can emit light through the opening. The cover box can be coupled to the mounting box in an operational position and in an open position. The operational position can occur when the hinge is inserted into the slot and the front panel covers the base. The open position can occur when the hinge is inserted into the slot and the front panel is disposed elevationally above the base.

Another exemplary embodiment of the invention includes a method for installing a light fixture. The method can include coupling a mounting box to a support structure. The mounting box can include a base and a wall extending outwardly from substantially the perimeter of the base. A top portion of the wall can include at least one hinge extending outwardly from the wall. The method also can include routing one or more electrical wires into the mounting box through an opening formed in the mounting box. The method also can include coupling a cover box to the mounting box in an open position. The cover box can include a front panel and a side panel extending outwardly from substantially the perimeter of the front panel. A top portion of the side panel can include at least one slot formed therein. The open position can occur when the hinge is inserted into the slot and the front panel is disposed elevationally above the base. The method also can include electrically coupling the electrical wires to a light source coupled to the cover box. The method further can include removing the cover box from the mounting box. The method also can include recoupling the cover box to the mounting box in an operational position. The operational position can occur when the hinge is inserted into the slot and the front panel covers the base.

BRIEF DESCRIPTION OF THE DRAWINGS

The foregoing and other features and aspects of the invention are best understood with reference to the following description of certain exemplary embodiments, when read in conjunction with the accompanying drawings, wherein.

Figure 1A:
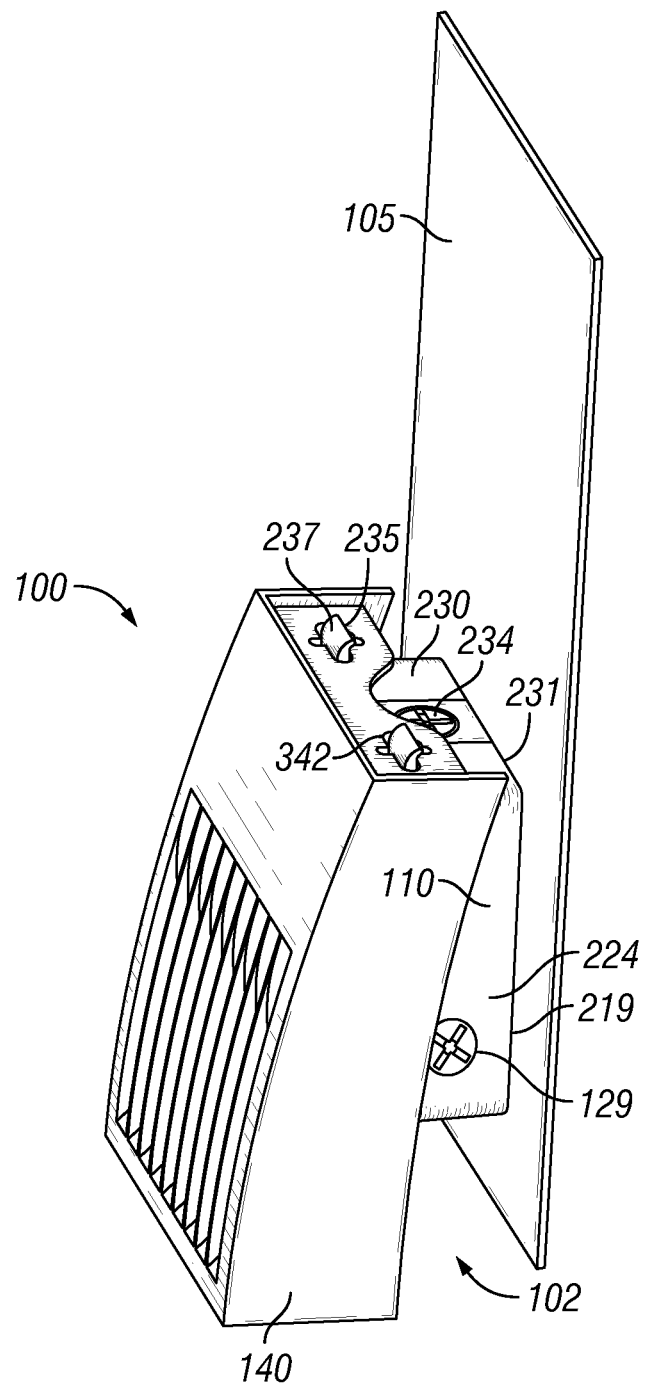
FIG. 1A is a perspective view of a wall pack light fixture in an operational position in accordance with an exemplary embodiment of the present invention.
Figure 1B:
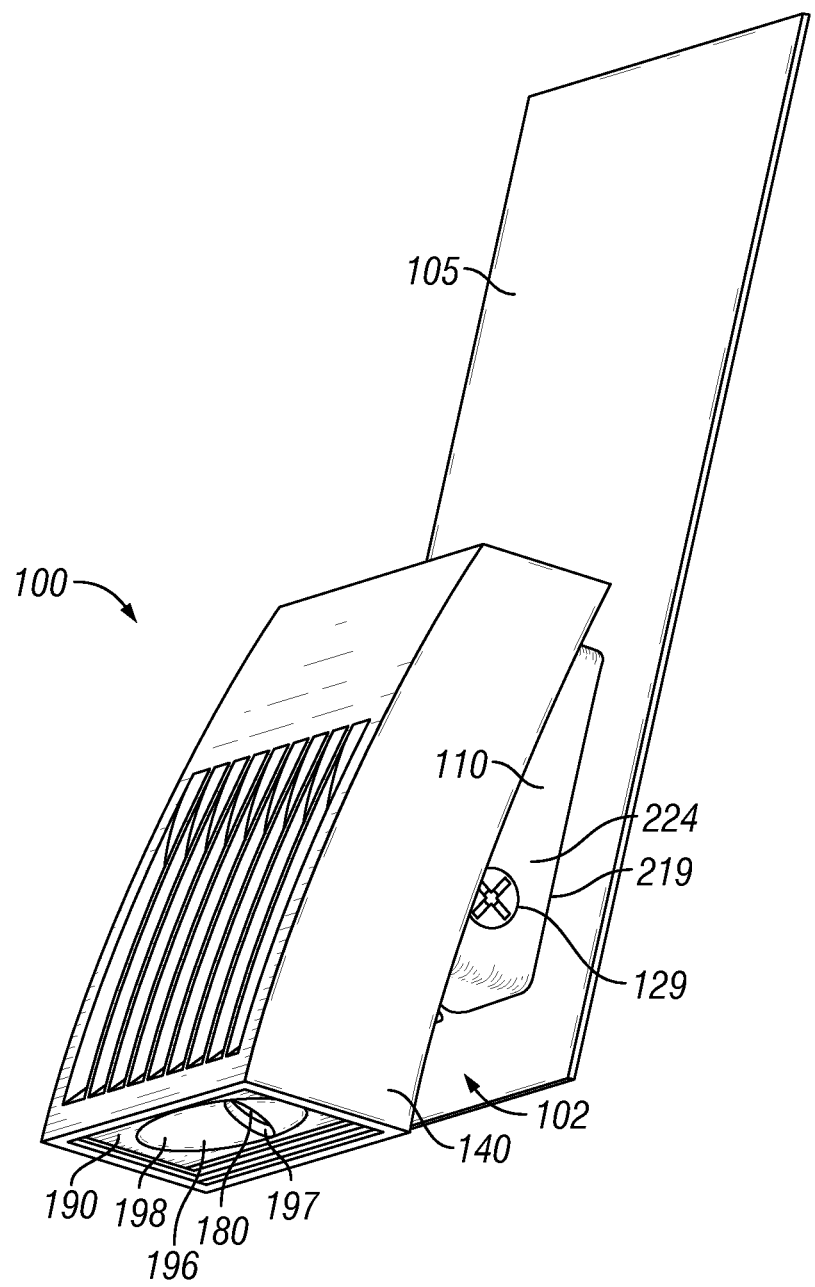
FIG. 1B is another perspective view of the wall pack light fixture of FIG. 1A in accordance with an exemplary embodiment of the present invention.
Figure 1C:
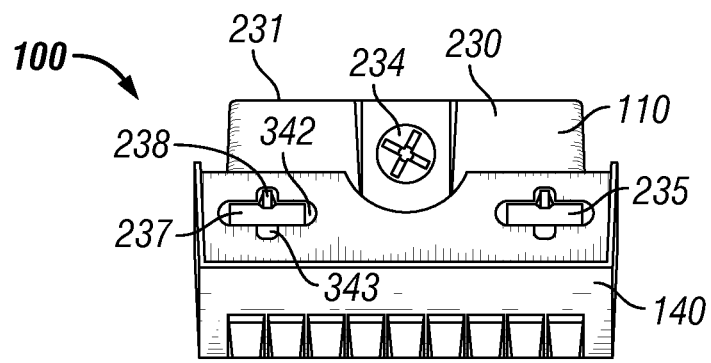
FIG. 1C is a top view of the wall pack light fixture of FIG. 1A in accordance with an exemplary embodiment of the present invention.
Figure 1D:
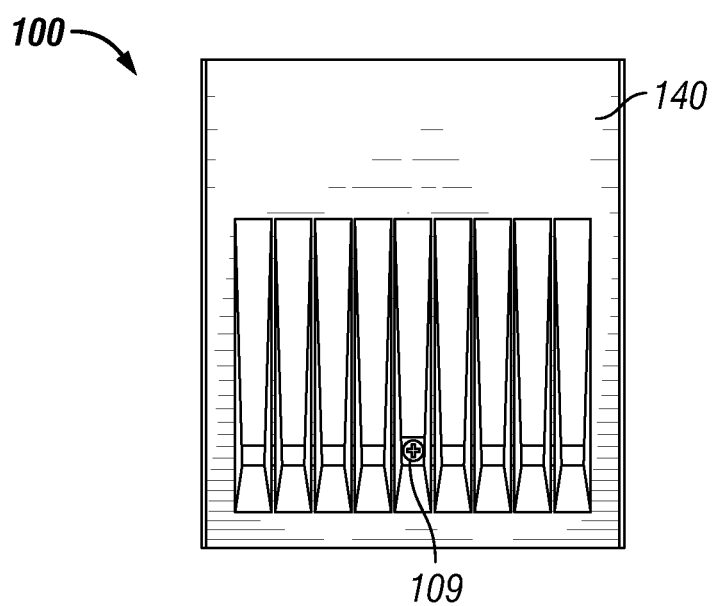
FIG. 1D is a front view of the wall pack light fixture of FIG. 1A in accordance with an exemplary embodiment of the present invention.

The drawings illustrate only exemplary embodiments of the invention and are therefore not to be considered limiting of its scope, as the invention may admit to other equally effective embodiments.

BRIEF DESCRIPTION OF EXEMPLARY EMBODIMENTS

The present invention is directed to wall pack light fixtures. Although the exemplary embodiment described below is of a wall pack light fixture using solid state light emitters, e.g., light emitting diodes ("LEDs") and LED packages, other exemplary embodiments of the invention use other light source types, such as compact fluorescent light bulbs, high intensity discharge ("HID") lamps, and halogen bulbs. The invention is better understood by reading the following description of non-limiting, exemplary embodiments with reference to the attached drawings, wherein like parts of each of the figures are identified by like reference characters, and which are briefly described as follows.

FIGS. 1A-1D show several views of a wall pack light fixture 100 in an operational position 102 in accordance with an exemplary embodiment of the present invention. Referring to FIGS. 1A-1D, the wall pack light fixture 100 includes a mounting box 110, a cover box 140, one or more light sources 180, and a lens 190. According to certain exemplary embodiments, the wall pack light fixture 100 also includes a driver 394 (FIG. 3C) and/or a reflector 196. In the operational position 102, the mounting box 110 is coupled to a support structure 105, such as a vertically oriented wall, and the cover box 140 is coupled to the mounting box 110.

Figure 2A:
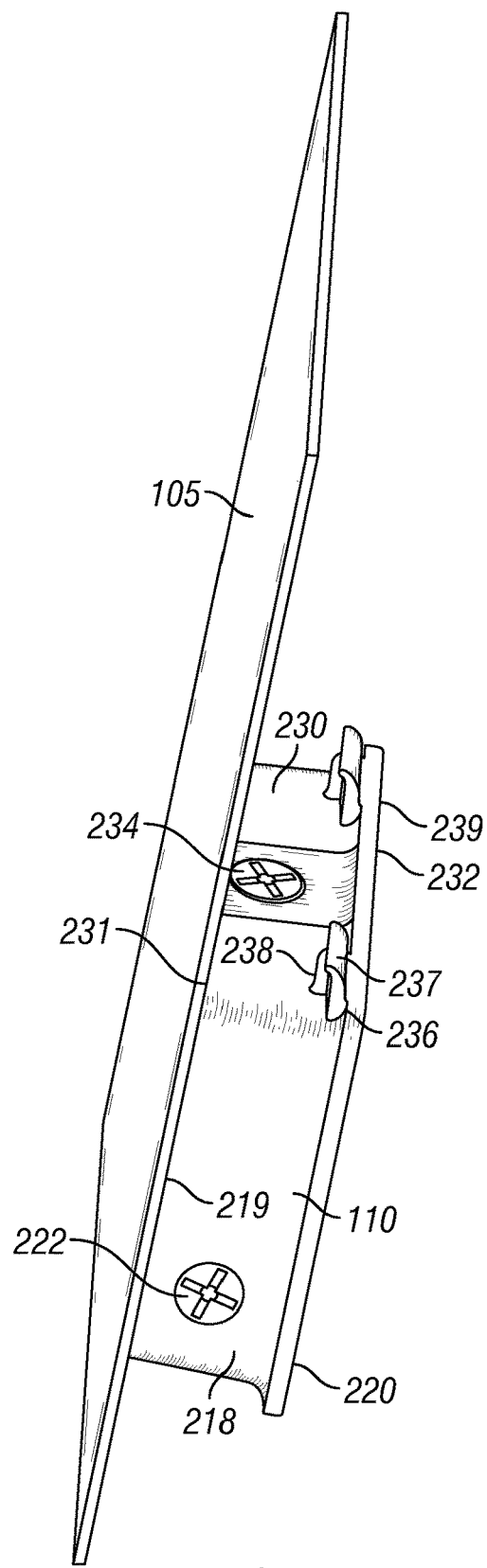
FIG. 2A is a perspective view of a mounting box of the wall pack light fixture of FIG. 1A mounted to a support structure in accordance with an exemplary embodiment of the present invention.
Figure 2B:
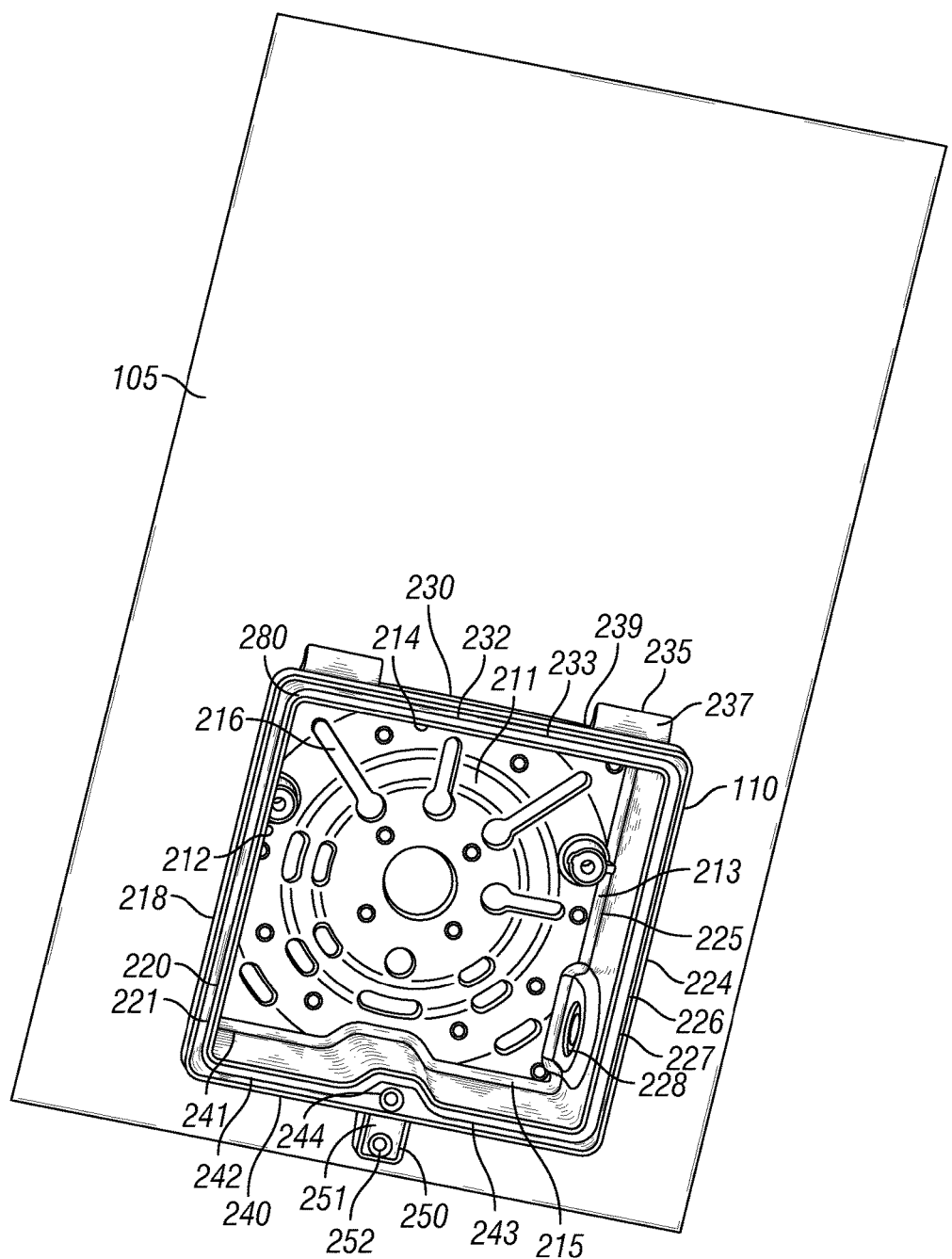
FIG. 2B is another perspective view of the mounting box of FIG. 2A in accordance with an exemplary embodiment of the present invention.

FIG. 2A is a perspective view of the mounting box 110 of the wall pack light fixture 100 mounted to the support structure 105 in accordance with an exemplary embodiment of the present invention. FIG. 2B is a front view of the mounting box 110 in accordance with an exemplary embodiment of the present invention. Referring to FIGS. 1A-2B, the mounting box 110 is substantially rectangular or square shaped, but is shaped in a substantially different geometric or non-geometric shape in other exemplary embodiments. The mounting box 110 is fabricated using die cast aluminum, but is fabricated using other suitable materials including, but not limited to, plastic, other metals, or metal alloys in other exemplary embodiments. The mounting box 110 includes a base 211, a first sidewall 218, a second sidewall 224, a top wall 230, and a bottom wall 240.

The base 211 is substantially rectangular or square shaped, but is shaped in a substantially different geometric or non-geometric shape in other exemplary embodiments. The base 211 includes a first edge 212, a second edge 213, a third edge 214, and a fourth edge 215. The first edge 212 is positioned opposite the second edge 213 and the third edge 214 is positioned opposite the fourth edge 215. The base 211 also includes one or more openings 216 allowing a fastening device (not shown), such as a screw or a nail, to be inserted therethrough to couple the mounting box 110 to the support structure 105. The openings 216 are formed during the formation of the base 211. Alternatively, the openings 216 are formed after the base 211 has been fabricated, such as by cutting portions of the base to form the openings 216. One or more of the openings 216 are shaped into various geometric and/or non-geometric shapes including, but not limited to, elongated slots, circles, or a combination of elongated slots having a circle at one end of the elongated slot. The base 211 also includes an aperture 217 positioned substantially at or near the center of the base 211. Alternatively, the aperture 217 is not included in the base 211 or is formed elsewhere within the base 211. The aperture 217 allows for electrical wires (not shown) to be passed through from within the support structure 105 into the mounting box 110, thereby allowing the electrical wires to be electrically coupled to the light sources 180, which is described in further detail below.

The first sidewall 218 extends outwardly from the first edge 212 in a substantially perpendicular manner. Alternatively, the first sidewall 218 extends outwardly from the first edge 212 in an angular manner. The first sidewall 218 includes a proximal end 219 positioned along the first edge 212 and a distal end 220. The distal end 220 forms a planar surface 221 that is substantially parallel to the base 211. According to certain exemplary embodiments, a first conduit opening (not shown) is formed within the first sidewall 218. The first conduit opening allows for electrical wires (not shown) to be passed through from within or adjacent to the support structure 105 into the mounting box 110, thereby allowing the electrical wires to be electrically coupled to the light sources 180, which is described in further detail below. In certain exemplary embodiments where the first conduit opening is not utilized, a first conduit cap 222 is coupled to the first sidewall 218 and covers the first conduit opening. The first conduit cap 222 is rotatably coupled to the first sidewall 218 within the first conduit opening in some exemplary embodiments. However, the first conduit cap 222 is coupled to the first sidewall 218 within the first conduit opening according to other suitable methods, such as snap-fitting, in other exemplary embodiments.

The second sidewall 224 extends outwardly from the second edge 213 in a substantially perpendicular manner. Alternatively, the second sidewall 224 extends outwardly from the second edge 213 in an angular manner. The second sidewall 224 includes a proximal end 225 positioned along the second edge 213 and a distal end 226. The distal end 226 forms a planar surface 227 that is substantially parallel to the base 211. According to some exemplary embodiments, the second sidewall's planar surface 227 lies substantially within the same plane as the first sidewall's planar surface 221. According to certain exemplary embodiments, a second conduit opening 228 is formed within the second sidewall 224. The second conduit opening 228 allows for electrical wires (not shown) to be passed through from within or adjacent to the support structure 105 into the mounting box 110, thereby allowing the electrical wires to be electrically coupled to the light sources 180, which is described in further detail below. In certain exemplary embodiments where the second conduit opening 228 is not utilized, a second conduit cap 129 is coupled to the second sidewall 224 and covers the second conduit opening 228. The second conduit cap 129 is rotatably coupled to the second sidewall 224 within the second conduit opening 228 in some exemplary embodiments. However, the second conduit cap 129 is coupled to the second sidewall 224 within the second conduit opening 228 according to other suitable methods, such as snap-fitting, in other exemplary embodiments.

The top wall 230 extends outwardly from the third edge 214 in a substantially perpendicular manner and also extends from one end of the first sidewall 218 to one end of the second sidewall 224. Alternatively, the top wall 230 extends outwardly from the third edge 214 in an angular manner instead of in a perpendicular manner. The top wall 230 includes a proximal end 231 positioned along the third edge 214 and a distal end 232. The distal end 232 forms a planar surface 233 that is substantially parallel to the base 211. According to some exemplary embodiments, the top wall's planar surface 233 lies substantially within the same plane as the first sidewall's planar surface 221 and the second sidewall's planar surface 227. According to some exemplary embodiments, the top wall's planar surface 233 forms a continuous surface with the first sidewall's planar surface 221 and the second sidewall's planar surface 227. According to certain exemplary embodiments, a top conduit opening (not shown) is formed within the top wall 230. The top conduit opening allows for electrical wires (not shown) to be passed through from within or adjacent to the support structure 105 into the mounting box 110, thereby allowing the electrical wires to be electrically coupled to the light sources 180, which is described in further detail below. In certain exemplary embodiments where the top conduit opening is not utilized, a top conduit cap 234 is coupled to the top wall 230 and covers the top conduit opening. The top conduit cap 234 is rotatably coupled to the top wall 230 within the top conduit opening in some exemplary embodiments. However, the top conduit cap 234 is coupled to the top wall 230 within the top conduit opening according to other suitable methods, such as snap-fitting, in other exemplary embodiments.

The top wall 230 also includes one or more hinges 235 positioned adjacent the distal end 232. There are two hinges 235 illustrated in one of the exemplary embodiments; however, greater or fewer hinges 235 are positioned on the top wall 230 in other exemplary embodiments. Each hinge 235 extends substantially perpendicularly outward from the top wall 230 in a direction substantially away from the bottom wall 240. Each hinge 235 includes a lower portion 236 and a top portion 237. The lower portion 236 extends substantially perpendicularly outward from the top wall 230 in a direction substantially away from the bottom wall 240. The lower portion 236 also extends in a direction parallel to the distal end 232. In certain exemplary embodiments, the lower portion 236 extends to about an outer edge 239 of the top wall's planar surface 233. The top portion 237 extends continuously from the end of the lower portion 236 in a direction away from the top wall 230 and in a direction away from the top wall's planar surface 233. Thus, the top portion 237 has a curvature shape. According to some exemplary embodiments, the hinge 235 also includes a locator 238 that extends substantially perpendicularly outward from the top wall 230 in a direction substantially away from the bottom wall 240 and substantially perpendicularly away from the lower portion 236. In some exemplary embodiments, the locator 238 extends from the lower portion 236 in a direction away from the top wall's planar surface 233. However, in certain exemplary embodiments, the locator 238 extends from the lower portion 236 in a direction towards the top wall's planar surface 233. This hinge 235 is formed as a single component in certain exemplary embodiments. In alternative exemplary embodiments, the hinge 235 is formed using several components that are subsequently coupled together. Although one configuration and/or shape of the hinge 235 is described and illustrated, other configurations and/or shapes of the hinge 235 can be used in other exemplary embodiments.

The bottom wall 240 extends outwardly from the fourth edge 215 in a substantially perpendicular manner and also extends from an opposing end of the first sidewall 218 to another end of the second sidewall 224. Alternatively, the bottom wall 240 extends outwardly from the fourth edge 215 in an angular manner instead of in a perpendicular manner. The bottom wall 240 includes a proximal end 241 positioned along the fourth edge 215 and a distal end 242. The distal end 242 forms a planar surface 243 that is substantially parallel to the base 211. According to some exemplary embodiments, the bottom wall's planar surface 243 lies substantially within the same plane as the first sidewall's planar surface 221, the second sidewall's planar surface 227, and the top wall's planar surface 233. According to some exemplary embodiments, the bottom wall's planar surface 243 forms a continuous surface with the first sidewall's planar surface 221, the second sidewall's planar surface 227, and the top wall's planar surface 233. According to certain exemplary embodiments, an opening 244 is formed within the bottom wall's planar surface 243 and extends through at least a portion of the bottom wall 240. The opening 244 is configured to receive a screw 109 or other known fastening device.

According to some exemplary embodiments, the bottom wall 240 also includes a protrusion 250. Protrusion 250 extends outwardly from the bottom wall 240 in a direction away from the top wall 230. A portion of the protrusion 250 forms a planar surface 251 adjacent to the bottom wall's planar surface 243. According to some exemplary embodiments, the protrusion's planar surface 251 lies substantially in the same plane as the bottom wall's planar surface 243. Similar to the opening 244 formed in the bottom wall's planar surface 243, a second opening 252 is formed in the protrusion's planar surface 251. The second opening 252 is configured to receive a screw (not shown), similar to screw 109, or other known fastening device. This second opening is utilized when coupling a larger sized cover box than cover box 140.

According to some exemplary embodiments, the mounting box 110 is molded as a single component. Alternatively, the mounting box 110 is formed from several components that are subsequently coupled to one another. In some exemplary embodiments, a gasket 280 is positioned on each of the first sidewall's planar surface 221, the second sidewall's planar surface 227, the top wall's planar surface 233, and the bottom wall's planar surface 243 prior to coupling the cover box 140 to the mounting box 110 in the operational position 102. The gasket 280 forms a seal between the mounting box 110 and the cover box 140 to prevent the ingress of moisture and other contaminants from a surrounding environment, thereby allowing the wall pack light fixture 100 to be operable in an outside environment. The gasket 280 is fabricated using a rubber material or any other known suitable material capable of being compressed and providing a seal.

FIGS. 3A-3D show several views of the cover box 140 in accordance with an exemplary embodiment of the present invention. Referring to FIGS. 1A-1D and 3A-3D, the cover box 140 has a substantially rectangular or square shaped front profile, but is shaped in a substantially different geometric or non-geometric shape in other exemplary embodiments. The cover box 140 is fabricated using die cast aluminum, but is fabricated using other suitable materials including, but not limited to, other metals or metal alloys that are capable of conducting heat in other exemplary embodiments. The cover box 140 is fabricated as a single component, but can be fabricated in multiple components and thereafter assembled together. The cover box 140 includes a front panel 310, a first side panel 330, a second side panel 335, a top panel 340, and a bottom panel 345, which collectively form a cavity region 320 therein.

The front panel 310 has a substantially rectangular or square shaped front profile, but is shaped in a substantially different geometric or non-geometric shape in other exemplary embodiments. The front panel 310 includes a first edge 321, a second edge 322, a third edge 323, and a fourth edge 324. The first edge 321 is positioned opposite the second edge 322 and the third edge 323 is positioned opposite the fourth edge 324. The first and second edges 321, 322 are curved, while the third and fourth edges 323, 324 are substantially straight. However, in alternative exemplary embodiments, the one or more of the edges 321, 322, 323, and 324 are different.

The front panel 310 includes a front surface 312 and a rear surface 314. The front surface 312 is viewable to an observer once the cover box 140 is coupled to the mounting box 110 in the operational position 102. The front surface 312 is formed having a non-planar, curvature shape. However, in other exemplary embodiments, the front surface 312 is substantially planar. The front panel 310 includes openings 316 formed therein that extend toward the rear surface 314, but does not extend through the rear surface 314. According to certain exemplary embodiments, the openings 316 are formed during the fabrication process of the cover box 140. Each opening 316 is substantially rectangularly shaped along the surface of the front surface 312 and is linearly aligned with an adjacent opening 316; however, one or more openings 316 are shaped differently and/or not linearly aligned with an adjacent opening 316 in other exemplary embodiments. Each opening 316 extends substantially longitudinally and extends in a direction substantially parallel to the first and second edges 321, 322. However, one or more openings 316 are oriented in a different manner in other exemplary embodiments.

A fin 317 is formed between adjacent openings 316 which allows for the removal of at least a portion of any accumulated heat that is generated by either the driver 394 and/or the light sources 180. Each fin 317 includes a first end 318 and a second end 319, which are both positioned along the front surface 312. Each fin 317 forms at least one edge of a corresponding opening 316. Also, each fin 317 extends inwardly towards the cavity region 320 from about the front surface 312 of the front panel 310, through the rear surface 314 of the front panel 310, and into the cavity region 320 of the cover box 140, which is adjacent to at least the rear surface 314. The portion of the fins 317 that extends from about the front surface 312 of the front panel 310 to the rear surface 314 of the front panel 310 is referred to as external fins 398. The portion of the fins 317 that extends from the rear surface 314 of the front panel 310 and into the cavity region 320 of the cover box 140 is referred to as internal fins 399. As the external fins 398 extend from about the front surface 312 of the front panel 310 towards the rear surface 314, the thickness of the external fins 398 increases. Alternatively, the thickness of one or more external fins 398 decreases, remains the same, increases, or is a combination of the aforementioned as the external fins 398 extend from about the front surface 312 of the front panel 310 toward the rear surface 314. Additionally, the distance that each external fin 398 extends from the front surface 312 towards the rear surface 314 is smaller at the first end 318 and the second end 319 of each external fin 398 and progressively increases along intermediate portions of the external fin 398 moving away from each of the first end 318 and the second end 319. In some exemplary embodiments, the distance that each external fin 398 extends from the front surface 312 towards the rear surface 314 is the greatest when a portion of the external fin 398 extends to a horizontally intermediate edge 315 that extends horizontally along the rear surface 314. This horizontally intermediate edge 315 is located near the lower portion of the rear surface 314 according to some exemplary embodiments. Alternatively, one or more external fins 398 travel from about the front surface 312 of the front panel 310 towards the rear surface 314 in a different manner than previously described. The shape and orientation of the external fins 398 promote air flow along the external fins 398 by creating a "chimney effect," which forces air in at the bottom of the external fins 398, causes the air to rise along the external fins 398, and forces the air out and away from the external fins 398 near the top of the external fins 398.

The front panel 310 includes an aperture 370 for receiving the screw 109, or other suitable fastening device, for coupling the cover box 140 to the mounting box 110. The aperture 370 is positioned between adjacent fins 317 and is aligned with the opening 244 (FIG. 2B) of the mounting box 110 when the cover box 140 is coupled to the mounting box 110 in the operational position 102. The aperture 370 is accessible from the front surface 112 of the front panel 110 and extends into the cavity region 320. According to one exemplary embodiment, the aperture 370 is positioned to extend substantially perpendicular through the horizontally intermediate edge 315 of the rear surface 314. However, the aperture 370 is positioned elsewhere on the front panel 310 in other exemplary embodiments, so long as the aperture is aligned with the opening 244 (FIG. 2B) when the cover box 140 is coupled to the mounting box 110 in the operational position 102.

The front panel 310 also includes one or more screw mounts 375 that extend from the rear surface 314 of the front panel 310 towards the cavity region 320. The screw mounts 375 are positioned between adjacent internal fins 399 and/or adjacent one or more internal fins 399. According to some exemplary embodiments, one or more screw mounts 375 are in contact with at least one of the internal fins 399. The screw mount 375 is circular in shape according to some exemplary embodiments and is capable of receiving a screw 376 for mounting the driver 396 to the front panel 310. Once mounted, the driver 396 is in thermal contact with one or more of the internal fins 399.

The first side panel 330 extends outwardly from the first edge 321 in a substantially perpendicular manner from the front panel 310 such that at least a portion of the first side panel 330 faces at least a portion of one of the fins 317. Alternatively, the first side panel 330 extends outwardly from the first edge 321 in an angular manner. Similarly, the second side panel 335 extends outwardly from the second edge 322 in a substantially perpendicular manner from the front panel 310 such that at least a portion of the second side panel 335 faces at least a portion of one of the fins 317. Alternatively, the second side panel 335 extends outwardly from the second edge 322 in an angular manner.

The top panel 340 extends outwardly from the rear surface 314 adjacent the third edge 323 in a substantially perpendicular manner and also extends from an upper portion of the first side panel 330 to an upper portion of the second side panel 335. Thus, the top panel 340 is not coupled to any edges of the front panel 310, the first side panel 330, and the second side panel 335. However, in alternative exemplary embodiments, at least one edge of the top panel 340 is coupled to at least one edge of the front panel 310, the first side panel 330, and the second side panel 335. Alternatively, the top panel 340 extends outwardly from the rear surface 314 in an angular manner instead of in a perpendicular manner. The top panel 340 includes two slots 342 formed therein, each slot 342 shaped to receive a corresponding hinge 235. In certain exemplary embodiments, each slot 342 is an elongated shape and extends in a direction parallel to the third edge 323. In some exemplary embodiments, each slot 342 includes one or more notches 343 extending substantially perpendicular to the elongated portion of the slot 342. The notch 343 is shaped to receive the locator 238 of the hinge 235, thereby properly positioning the cover box 140 to the mounting box 110. In certain exemplary embodiments, fewer slots 342 are formed in the top panel 340 than corresponding hinges 235 on the top wall 230. For example, a single elongated slot extending substantially parallel to the third edge 323 is formed in the top panel 340. This single elongated slot is shaped to receive both hinges 235 coupled to the top wall 230 therein.

The bottom panel 345 extends outwardly from the rear surface 314 at the fourth edge 324 in a substantially perpendicular manner and also extends from a lower edge of the first side panel 330 to a lower edge of the second side panel 335. However, in alternative exemplary embodiments, at least one edge of the bottom panel 345 is coupled to at least one lower portion of the front panel 310, the first side panel 330, and the second side panel 335. Alternatively, the bottom panel 345 extends outwardly from the rear surface 314 in an angular manner instead of in a perpendicular manner. An opening 346 is formed at the surface of the bottom panel 345 and extends toward the top panel 340 thereby forming a compartment 347. The compartment 347 is separated from the cavity region 320 by a compartment wall 348. The compartment wall 348 includes a internal surface 349 facing the opening 346 and an exterior surface 350. In certain exemplary embodiments, one or more fins 351 extend substantially vertically from along a portion of the exterior surface 350 of the compartment wall 348 to the rear surface 314 of the front panel 310. In certain exemplary embodiments, the fins 351 extend to a portion of the rear surface 314 that is positioned at and between the horizontally intermediate edge 315 of the rear surface 314 and the fourth edge 324 of the front panel 310. These fins 351 assist in removing heat generated from the light sources 180 and allow the heat to be transferred to the rear surface 314 and then the fins 317.

In certain exemplary embodiments, the cover box 140 also includes a sealing panel 360 extending into the cavity region 320 from the rear surface 314 of the front panel 310. The sealing panel 360 is sized and shaped to be similar to the collective shape of the bottom wall's planar surface 243 (FIG. 2B), the first sidewall's planar surface 221 (FIG. 2B), the second sidewall's planar surface 227 (FIG. 2B), and the top wall's planar surface 233 (FIG. 2B) of the mounting box 110. Thus, once the cover box 140 is coupled to the mounting box 110 in the operational position 102, the sealing panel 360 is pressed into the gasket 280 that is disposed atop each of the bottom wall's planar surface 243 (FIG. 2B), the first sidewall's planar surface 221 (FIG. 2B), the second sidewall's planar surface 227 (FIG. 2B), and the top wall's planar surface 233 (FIG. 2B) of the mounting box 110, thereby forming a seal.

The driver 394 is electrically communicable with the one or more light sources 180 using a cable (not shown) and is also electrically coupled to the electrical wires routed into the mounting box 110 from or adjacently from the support structure 105. The driver 394 provides power to the one or more light sources 180 and also controls the intensity and/or color of the light sources 180. For example, the driver 394 is capable of dimming the light sources 180 if desired. The driver 394 produces heat which is removed from within the wall pack light fixture 100 to an external area outside of the wall pack light fixture via the fins 317. As previously mentioned, the driver 394 is coupled to one or more fins 317 within the cavity region 320. However, in other exemplary embodiments, the driver 394 is coupled to the mounting box 110 without departing from the scope and spirit of the exemplary embodiment.

According to this exemplary embodiment, the light source 180 includes one or more LED die packages, or LEDs, coupled to a substrate (not shown). The substrate is mounted to the internal surface 349 of the compartment wall 348 and is oriented so that the LED die packages 180 are emitting light towards the opening 346. However, in other exemplary embodiments, the substrate and hence the light source 180 is coupled to the mounting box 110 without departing from the scope and spirit of the exemplary embodiment. The substrate includes one or more sheets of ceramic, metal, laminate, circuit board, Mylar®, or another material. Each LED die package 180, or LED, includes a chip of semi-conductive material that is treated to create a positive-negative ("p-n") junction. When the LED die packages 180, or LEDs, are electrically coupled to a power source, such as the driver 394, current flows from the positive side to the negative side of each junction, causing charge carriers to release energy in the form of incoherent light.

The wavelength or color of the emitted light depends on the materials used to make the LED die packages 180, or LEDs. For example, a blue or ultraviolet LED typically includes gallium nitride ("GaN") or indium gallium nitride ("InGaN"), a red LED typically includes aluminum gallium arsenide ("AlGaAs"), and a green LED typically includes aluminum gallium phosphide ("AlGaP"). Each of the LEDs in the LED die package 180 can produce the same or a distinct color of light. For example, in certain exemplary embodiments, the LED die package 180 includes one or more white LEDs and one or more non-white LEDs, such as red, yellow, amber, or blue LEDs, for adjusting the color temperature output of the light emitted from the fixture 100. A yellow or multi-chromatic phosphor may coat or otherwise be used in a blue or ultraviolet LED to create blue and red-shifted light that essentially matches blackbody radiation. The emitted light approximates or emulates "white," incandescent light to a human observer. In certain exemplary embodiments, the emitted light includes substantially white light that seems slightly blue, green, red, yellow, orange, or some other color or tint. In certain exemplary embodiments, the light emitted from the LED die packages 180, or LEDs, has a color temperature between 2500 and 5000 degrees Kelvin.

In certain exemplary embodiments, an optically transmissive or clear material (not shown) encapsulates at least a portion of each LED die package 180, or LED. This encapsulating material provides environmental protection while transmitting light from the LED die package 180, or LED. In certain exemplary embodiments, the encapsulating material includes a conformal coating, a silicone gel, a cured/curable polymer, an adhesive, or some other material known to a person of ordinary skill in the art having the benefit of the present disclosure. In certain exemplary embodiments, phosphors are coated onto or dispersed in the encapsulating material for creating white light. In certain exemplary embodiments, the white light has a color temperature between 2500 and 5000 degrees Kelvin.

In certain exemplary embodiments, the LED die packages 180, or LEDs, includes one or more arrays of LED die packages 180, or LEDs, that are collectively configured to produce a lumen output from 1 lumen to 5000 lumens. The LED die packages 180, or LEDs, are attached to the substrate by one or more solder joints, plugs, epoxy or bonding lines, and/or other means for mounting an electrical/optical device on a surface. The substrate is electrically connected to support circuitry (not shown) and/or the driver 394 for supplying electrical power and control to the LED die packages 180, or LEDs. For example, one or more wires (not shown) couple opposite ends of the substrate to the driver 394, thereby completing a circuit between the driver 394, the substrate, and the LED die packages 180, or LEDs.

The reflector 196 is fabricated from a plastic material according to some exemplary embodiments, while in others, the reflector 196 is formed from other suitable materials, such as aluminum, any other reflective type material, or any material capable of having its surface be made reflective. In some exemplary embodiments, the plastic material is injection molded and vacuum metalized to form the reflector 196. The reflector 196 is made from a single component or is made from several components that are subsequently coupled together. The reflector 196 includes one or more openings 197 that is disposed around each of the light sources 180 once inserted within the compartment 347. The reflector 196 also includes an interior surface 198 that faces the opening 346 once inserted within the compartment 347. The interior surface 198 is finished to be reflective to light using methods known to people having ordinary skill in the art. For example, the interior surface 198 can be polished, coated with a reflective material, fabricated using a reflective material, or made reflective using other methods known to people having ordinary skill in the art.

The lens 190 is disposed over the light sources 180 to collectively encapsulate the light sources 180. The lens 190 is coupled to the bottom panel 345 over the perimeter of the opening 346 using VHB® adhesive tape, silicone adhesive, or any other known adhesive. In alternative exemplary embodiments, the lens 190 is coupled to the bottom panel 345 over the perimeter of the opening 346 using brackets (not shown) and/or other fasteners that are known to people having ordinary skill in the art, such as a slot formed adjacently around the perimeter of the opening 346 wherein the edges of the lens 190 are inserted therein. In one exemplary embodiment, the lens 190 is fabricated from an optically transmissive material or clear material including, but not limited to, plastic, glass, silicone, or other material known to people having ordinary skill in the art. According to certain exemplary embodiments, the lens 190 encapsulates at least some of the light sources 180 individually. The lens 190 provides environmental protection while allowing light emitted by the light sources 180 to pass therethrough toward the desired illumination area. In certain other exemplary embodiments, the lens 190 focuses light toward the desired illumination area and creates a desired light distribution. In certain exemplary embodiments, the lens 190 diffuses the light emitted from the light sources 180. In yet another exemplary embodiment, the lens 190 creates an insulation between the light sources 180 and human contact. The lens 190 has a substantially planar shape; however, the lens 190 is formed into other geometric or non-geometric shapes in other exemplary embodiments.

Figure 4A:
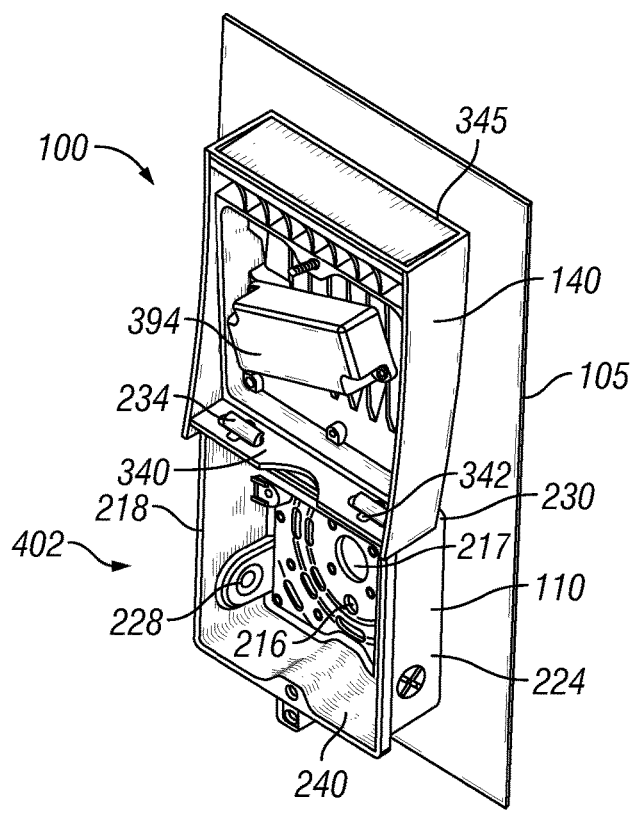
FIG. 4A is a perspective view of the wall pack light fixture of FIG. 1A in an open position in accordance with an exemplary embodiment of the present invention.
Figure 4B:
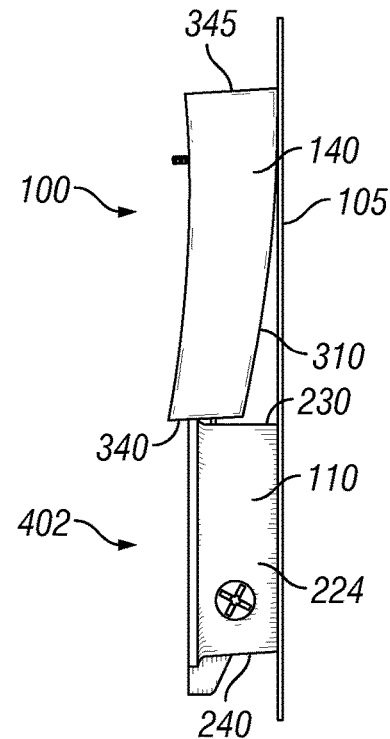
FIG. 4B is a side view of the wall pack light fixture of FIG. 4A in accordance with an exemplary embodiment of the present invention.

FIG. 4A is a perspective view of the wall pack light fixture 100 in an open position 402 in accordance with an exemplary embodiment of the present invention. FIG. 4B is a side view of the wall pack light fixture 100 in the open position 402 in accordance with an exemplary embodiment of the present invention. Referring to FIGS. 4A-4B and 1A-1D, the installation of the wall pack light fixture 100 is described. Although the description provided below is presented in a certain order, it is realized that the order of the installation steps can be varied.

Referring to FIGS. 4A-4B, the electrical wires (not shown) located within the support structure 105 or located adjacent to the support structure 105 are made accessible. These electrical wires are routed into the mounting box 110 through at least one of the aperture 217 or the conduit openings 228 positioned within any of the first sidewall 218, the second sidewall 224, and the top wall 230. The mounting box 110 is oriented against the support structure 105 with the top wall 230 being elevationally higher than the bottom wall 240. According to some exemplary embodiments, the top wall 230 is leveled substantially horizontally. Once oriented, the mounting box 110 is coupled to the support structure 105 by inserting screws or other fastening devices through one or more openings 216. Alternatively, the mounting box 110 is coupled to the support structure 105 using other known fastening devices, such as nails or clips.

The cover box 140 is coupled to the mounting box 110 in the open position 402 by placing the top panel 340 of the cover box 140 adjacent to the top wall 240 of the mounting box 110 and inserting each of the hinges 234 through the corresponding slots 342. In the open position 402, the bottom panel 345 of the cover box 140 is positioned elevationally higher than the top panel 340 and the front panel 310 is adjacent the support structure 105. According to certain exemplary embodiments, the cover box 140 is resting against the support structure 105 because the center of gravity of the cover box 140 is closer towards the support structure 105 while in the open position 402. The shape of the hinge 234 prevents the cover box 140 from being inadvertently removed from the mounting box 110. Specifically, the curvature shape of the top portion 237 (FIG. 2A) prevents the cover box 140 from being accidentally removed off of the mounting box 110. The cover box 140 is vertically lifted off of the mounting box 110 to remove the cover box 140 from the mounting box 110. While in the open position 402, the installer is able to use two hands and make the proper wiring connections between the driver 394 and the electrical wires. Upon completing the wiring, the installer has the ability to verify that the installation has been performed properly.

Figure 3A:
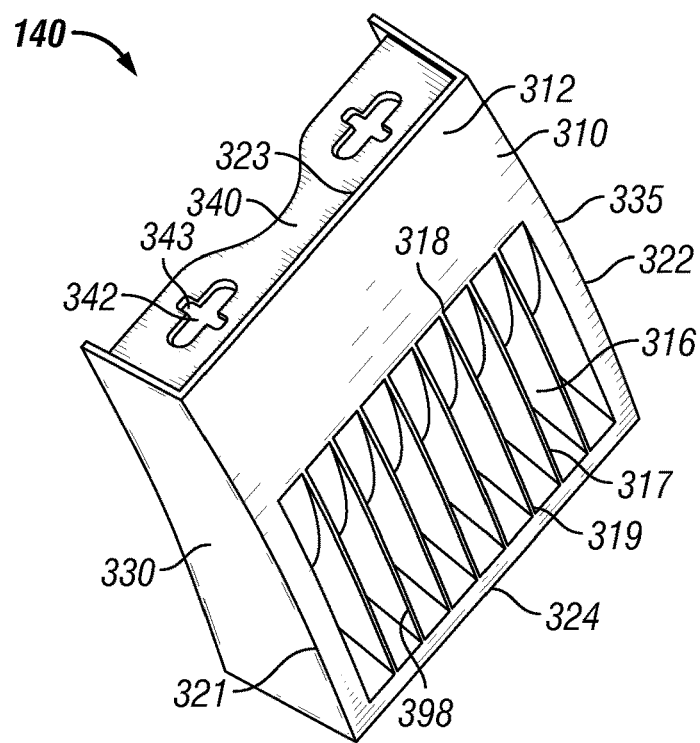
FIG. 3A is a perspective view of a cover box of the wall pack light fixture of FIG. 1A in accordance with an exemplary embodiment of the present invention.
Figure 3B:
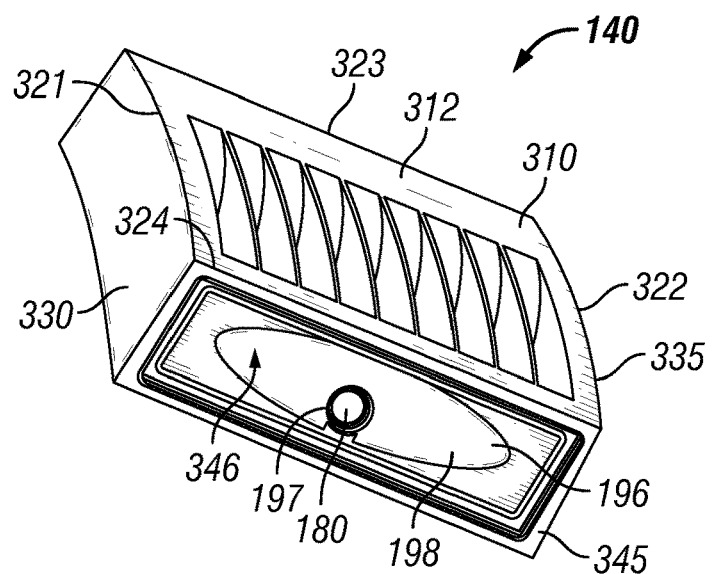
FIG. 3B is another perspective view of the cover box of FIG. 3A in accordance with an exemplary embodiment of the present invention.
Figure 3C:
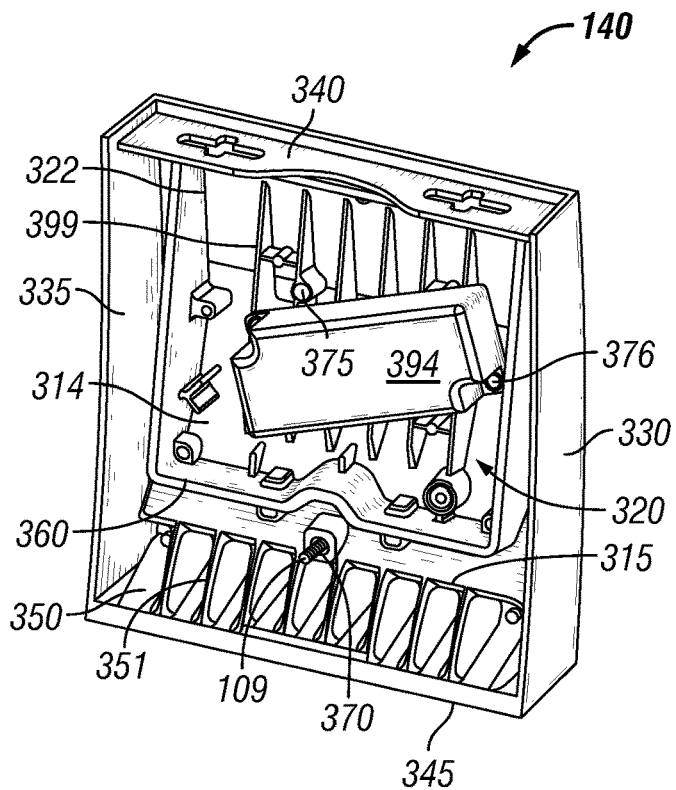
FIG. 3C is a rear perspective view of the cover box of FIG. 3A in accordance with an exemplary embodiment of the present invention.
Figure 3D:
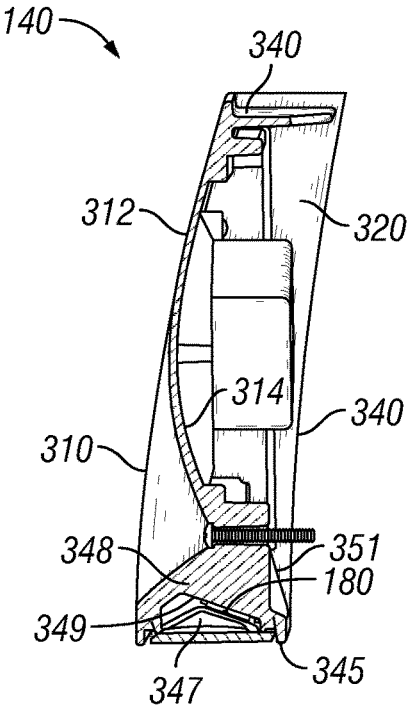
FIG. 3D is a cross-sectional view of the cover box of FIG. 3A in accordance with an exemplary embodiment of the present invention.

Once the wiring has been completed, the installer removes the cover box 140 off of the hinges 235, rotates the cover box 180 degrees, and recouples the cover box 140 to the mounting box 110 in the operational position 102 (FIGS. 1A-1D). Referring to FIGS. 1A-1D, when recoupling the cover box 140 to the mounting box 110 in the operational position 102, the hinges 235 are inserted through the corresponding slots 342 from the cavity region 320 (FIG. 3C). The locator 238 is aligned to be inserted through a corresponding notch 343, which properly aligns the cover box 140 to the mounting box 110.

Once the cover box 140 is positioned in the operational position 102, the screw 109 is tightened to firmly press the gasket 280 (FIG. 2B) to each of the first sidewall's planar surface 221 (FIG. 2B), the second sidewall's planar surface 227 (FIG. 2B), the top wall's planar surface 233 (FIG. 2B), and the bottom wall's planar surface 243 (FIG. 2B), thereby creating a seal.

Although each exemplary embodiment has been described in detail, it is to be construed that any features and modifications that are applicable to one embodiment are also applicable to the other embodiments. Furthermore, although the invention has been described with reference to specific embodiments, these descriptions are not meant to be construed in a limiting sense. Various modifications of the disclosed embodiments, as well as alternative embodiments of the invention will become apparent to persons of ordinary skill in the art upon reference to the description of the exemplary embodiments. It should be appreciated by those of ordinary skill in the art that the conception and the specific embodiments disclosed may be readily utilized as a basis for modifying or designing other structures or methods for carrying out the same purposes of the invention. It should also be realized by those of ordinary skill in the art that such equivalent constructions do not depart from the spirit and scope of the invention as set forth in the appended claims. It is therefore, contemplated that the claims will cover any such modifications or embodiments that fall within the scope of the invention.

What is claimed is:

1. A light fixture comprising:
   a housing comprising:
      a mounting box forming a first cavity; and
      a cover box that fastens to the mounting box, the cover box forming a second cavity, the cover box comprising:
         a first side that faces the mounting box when the cover box is fastened to the mounting box;
         a first plurality of walls defining an outer perimeter of the cover box;
         a sealing surface within the second cavity and within the outer perimeter of the cover box, the sealing surface engaging the mounting box when the cover box is fastened to the mounting box;
         a second side that faces away from the mounting box when the cover box is fastened to the mounting box;
         a lower portion of the cover box;
         at least one light emitting diode (LED) oriented to emit light from the lower portion; and
         a driver that is mounted to the cover box and electrically connected to the at least one light emitting diode.

2. The light fixture of claim 1, wherein the mounting box comprises a second plurality of sidewalls on which a gasket sits, the sealing surface engaging the gasket on the second plurality of sidewalls of the mounting box when the cover box is fastened to the mounting box.

3. The light fixture of claim 1, wherein the cover box comprises heat sink fins.

4. The light fixture of claim 1, wherein the lower portion of the cover box comprises heat sink fins.

5. The light fixture of claim 1, further comprising a reflector mounted in the lower portion.

6. The light fixture of claim 5, wherein the LED is disposed at an aperture of the reflector.

7. The light fixture of claim 1, further comprising a plurality of projections on the mounting box, the plurality of projections configured to support the cover box during installation of the light fixture.

8. The light fixture of claim 1, wherein when the cover box is fastened to the mounting box, the driver is disposed in an enclosed volume defined by the cover box and the mounting box.

9. A light fixture comprising:
   a housing comprising:
      a mounting box having a first length, the mounting box forming a first cavity; and
      a cover box that fastens to the mounting box, the cover box having a second length that is longer than the first length, the cover box comprising:
         a second cavity that faces the mounting box when the cover box is fastened to the mounting box;
         a sealing surface within the second cavity, the sealing surface engaging the mounting box when the cover box is fastened to the mounting box;
         a lower portion; and
         at least one light emitting diode (LED) oriented to emit light from the lower portion; and
      a driver that is mounted within the housing and electrically connected to the at least one light emitting diode.

10. The light fixture of claim 9, wherein the mounting box comprises a plurality of sidewalls on which a gasket sits, the sealing surface engaging the gasket on the plurality of sidewalls of the mounting box when the cover box is fastened to the mounting box.

11. The light fixture of claim 9, wherein the cover box comprises heat sink fins.

12. The light fixture of claim 9, wherein the lower portion of the cover box comprises heat sink fins.

13. The light fixture of claim 9, further comprising a reflector mounted in the lower portion.

14. The light fixture of claim 13, wherein the LED is disposed at an aperture of the reflector.

15. The light fixture of claim 9, further comprising a plurality of projections on the mounting box, the plurality of projections configured to support the cover box during installation of the light fixture.

16. The light fixture of claim 9, wherein when the cover box is fastened to the mounting box, the driver is disposed in an enclosed volume defined by the cover box and the mounting box.

17. A light fixture comprising:
a housing comprising:
  a mounting box forming a first cavity; and
  a cover box that fastens to the mounting box, the cover box comprising:
    a second cavity that faces the mounting box when the cover box is fastened to the mounting box;
    a sealing surface within the second cavity, the sealing surface engaging the mounting box when the cover box is fastened to the mounting box; and
    a lower portion comprising at least one light emitting diode (LED) oriented to emit light from the cover box; and
  a driver that is mounted within the housing and electrically connected to the at least one light emitting diode.

18. The light fixture of claim 17, wherein the cover box comprises heat sink fins.

19. The light fixture of claim 17, wherein the lower portion comprises at least one reflector.

20. The light fixture of claim 17, further comprising a plurality of projections on the mounting box, the plurality of projections configured to support the cover box during installation of the light fixture.

* * * * *